US006965215B2

(12) United States Patent
MacDougall (10) Patent No.: US 6,965,215 B2
(45) Date of Patent: Nov. 15, 2005

(54) CAPACITOR PULSE FORMING NETWORK WITH MULTIPLE PULSE INDUCTORS

(75) Inventor: Frederick W. MacDougall, San Diego, CA (US)

(73) Assignee: General Atomics, San Diego, CA (US)

( * ) Notice: Subject to any disclaimer, the term of this patent is extended or adjusted under 35 U.S.C. 154(b) by 70 days.

(21) Appl. No.: 10/772,748

(22) Filed: Feb. 4, 2004

(65) Prior Publication Data

US 2005/0168195 A1     Aug. 4, 2005

(51) Int. Cl.⁷ ...................... H01M 10/44; H01M 10/46
(52) U.S. Cl. ..................................... 320/139; 320/166
(58) Field of Search ........................ 320/116, 135, 139, 320/141, 166

(56) References Cited

U.S. PATENT DOCUMENTS

| | | |
|---|---|---|
| 2,294,863 A | 9/1942 | Hadfield |
| 2,764,678 A | 9/1956 | Craib |
| 3,051,906 A | 8/1962 | Haynes |
| 3,578,986 A | 5/1971 | McGuffin et al. |
| 3,590,279 A | 6/1971 | Thompson et al. |
| 3,955,106 A | 5/1976 | Berry |
| 3,980,895 A | 9/1976 | Schrader |
| 4,090,140 A | 5/1978 | Carter |
| 4,150,307 A | 4/1979 | Loucks |
| 4,196,359 A | 4/1980 | North et al. |
| 4,296,358 A | 10/1981 | Bernier |
| 4,343,223 A | 8/1982 | Hawke et al. |
| 4,381,476 A | 4/1983 | Adachi et al. |
| 4,521,889 A | 6/1985 | Cirkel et al. |
| 4,549,091 A | 10/1985 | Fahlen et al. |
| 4,556,981 A | 12/1985 | Cirkel et al. |
| 4,558,404 A | 12/1985 | James |
| 4,630,277 A | 12/1986 | Cirkel et al. |
| 4,684,820 A | 8/1987 | Valencia |
| 4,684,821 A | 8/1987 | Picone et al. |
| 4,700,354 A | 10/1987 | Cirkel et al. |
| 4,745,613 A | 5/1988 | Tye et al. |
| 4,887,275 A | 12/1989 | Cirkel et al. |
| 5,017,834 A | 5/1991 | Farnsworth |
| 5,083,093 A | 1/1992 | Adler et al. |
| 5,317,376 A | 5/1994 | Amzajerdian et al. |
| 5,463,648 A | 10/1995 | Gibbs |
| 5,559,404 A | 9/1996 | MacDougall et al. |
| 5,703,891 A | 12/1997 | Phillips et al. |
| 6,142,131 A | 11/2000 | Wortman et al. |
| 6,359,420 B1 | 3/2002 | Hitchcock |
| 6,516,153 B2 * | 2/2003 | Honda et al. ............... 320/166 |
| 6,664,762 B2 * | 12/2003 | Kutkut ....................... 320/116 |

* cited by examiner

Primary Examiner—Edward H. Tso
(74) Attorney, Agent, or Firm—Thomas F. Lebens; Fitch, Even, Tabin & Flannery (57) ABSTRACT

Capacitor based pulse forming networks and related methods are provided which require fewer inductors are that pulsed more frequently to provide a smaller, lower mass, and lower inductance pulse forming network having better pulse shaping characteristics than conventional pulse forming networks. In one implementation, the invention can be characterized as a capacitor based pulse forming network comprising a plurality of inductors adapted to be coupled to a load, a plurality of capacitor units, and a plurality of switches. Each switch couples a respective capacitor unit to a respective inductor, wherein multiple capacitor units are coupled to each inductor by separate switches. The plurality of switches are adapted to non-simultaneously discharge the multiple capacitor units to provide non-simultaneous pulses through a given inductor to the load and not through other inductors. The non-simultaneous pulses form at least a portion of an output pulse waveform to the load.

35 Claims, 7 Drawing Sheets

CAPACITOR PULSE FORMING NETWORK WITH MULTIPLE PULSE INDUCTORS

BACKGROUND OF THE INVENTION

1. Field of the Invention

The present invention relates generally to capacitor-based high energy pulse forming networks.

2. Discussion of the Related Art

In certain applications where high power sources (e.g., power lines, batteries) are unable to deliver high levels of peak power, pulse forming networks having high-energy density capacitors are often used. In these applications, the capacitors are slowly charged from the power source and then quickly discharged for short time periods to provide pulsed energy at high peak power levels. The capacitors are typically used with large inductors to restrict the flow of energy from the capacitors and to establish the frequency, period and shape of the output pulse from the network.

Figure 1:
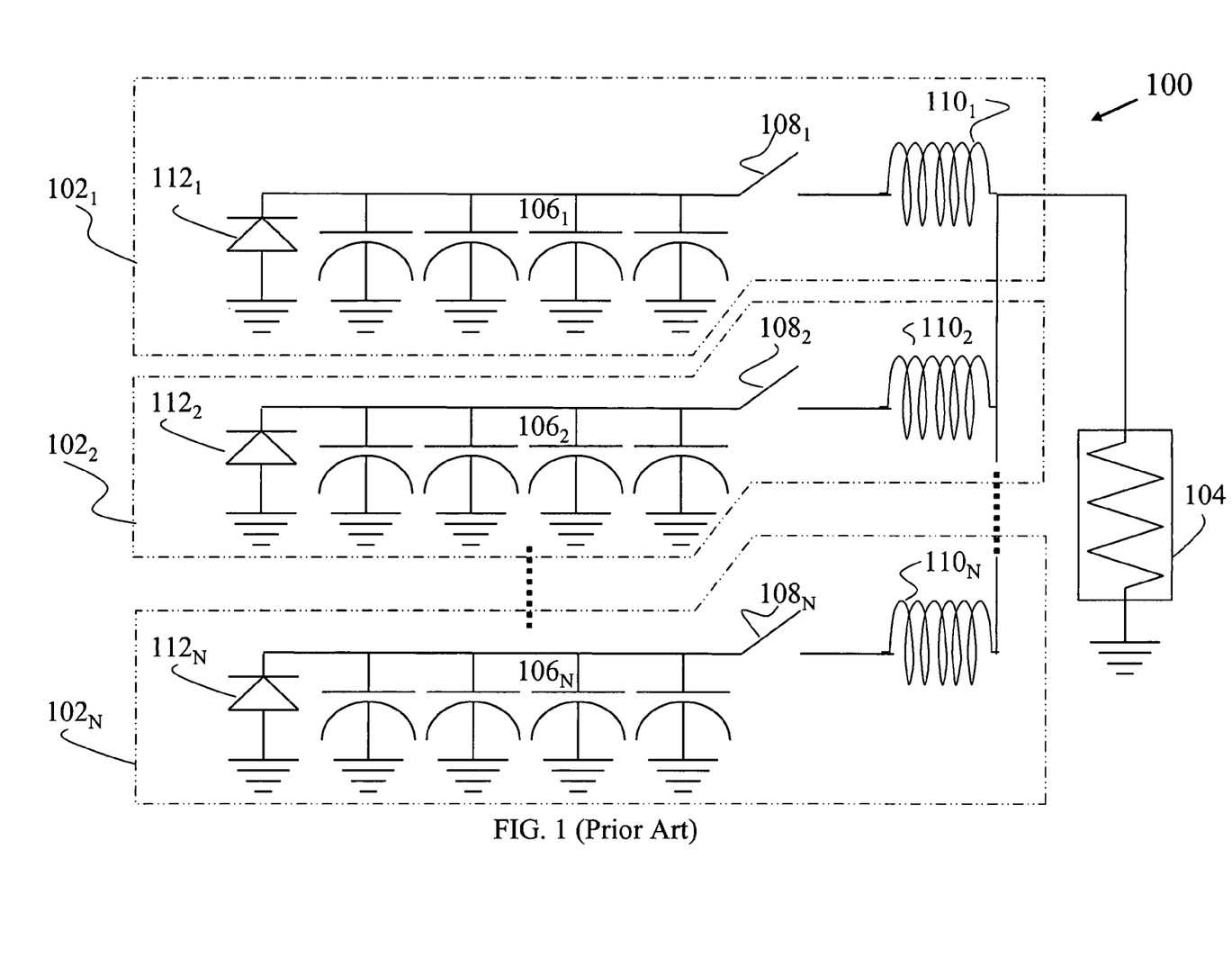
FIG. 1 is a diagram of a conventional pulse forming network which discharges energy storage capacitors through inductors.

FIG. 1 illustrates a known pulse forming network 100 including a number n of modules $102_n$ (where n=1, 2, ..., N) coupled to a load 104. Each module $102_n$ includes a bank of capacitors $106_n$ coupled to the load 104 through an inductor $110_n$ via a switch $108_n$ and an anti-reversing diode $112_n$. In operation, each bank of capacitors $106_n$ is charged while the switches $108_n$ are open. Once charged, groups of modules $102_n$ are sequentially discharged to the load 104. For example, initially, a predetermined number of modules (a first set of modules) are discharged at once to the load 104. That is, the switches 108 for the first set of modules are closed at once, discharging the energy stored through the inductors 110 corresponding to the first set of modules to the load producing a current pulse to the load 104. At a point in time after the discharge of the first set of modules is initiated, a second set of modules 102 are discharged at once to the load producing a second current pulse to the load. After the initiation of the discharge of the second set of modules, a third set of modules is discharged at once to the load producing a third current pulse, and so on. The pulses add, creating the output pulse waveform at the load. The anti-reversing diodes $112_n$ of each module $102_n$ prevent the voltage from reversing on the capacitors (which prevents the capacitors from recharging from their own discharge current) and ensure that the current discharging from other sets of modules flows to the load 104. Typically, in most high power pulse forming networks, there are 3–5 sets of modules, each set being discharged at the same time, the sets being discharged in sequence.

Figure 2:
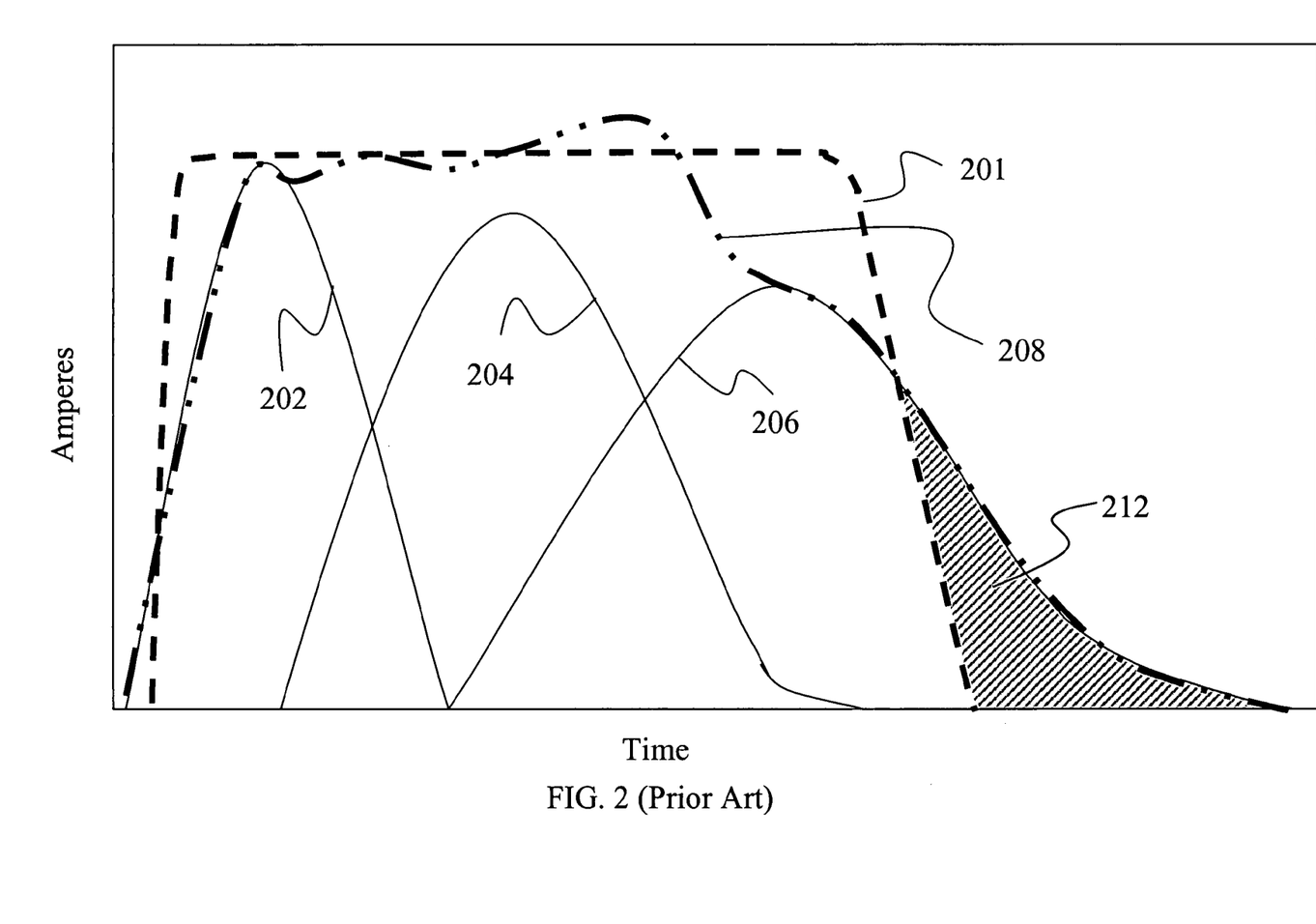
FIG. 2 is a graph illustrating a typical pulse waveform formed by the pulse forming network of FIG. 1.

FIG. 2 is a graph of current over time illustrating a typical pulse waveform formed by the pulse forming network 100 of FIG. 1 including 72 modules (i.e., N=72) divided into 3 sets of modules. For example, modules $102_1$–$102_{24}$ are then discharged at the same time forming current pulse 202, modules $102_{25}$–$102_{48}$ are then discharged at the same time forming pulse 204, and modules $102_{49}$–$102_{72}$ are discharged at the same time forming pulse 206. The pulses add to produce waveform 208 as compared to the desired flat top waveform 201, emulating a square or rectangular pulse.

This pulse forming network results in many inductors (e.g., 72 in this example) representing a large mass in the pulse forming network. Furthermore, the waveform 208 does not accurately track the desired flat top waveform 201, especially at the end of the waveform. Additionally, significant energy is wasted at the end of the waveform (which is illustrated as area 212 under the curve of waveform 208). Accordingly, the energy storage requirements of the pulse forming network 100 must be increased in order to provide enough current in view of the wasted energy. Requiring many large inductors and needing to provide additional energy storage due to wasted energy adds to the mass and size of the pulse forming network, as well as increases the flux generated by the inductors.

SUMMARY OF THE INVENTION

The invention provides a capacitor based pulse forming network in which fewer inductors are pulsed more frequently to provide a smaller, lower mass, and lower inductance pulse forming network having better pulse shaping characteristics than conventional pulse forming networks.

In one embodiment, the invention can be characterized as a capacitor based pulse forming network comprising: a plurality of inductors adapted to be coupled to a load; a plurality of capacitor units; and a plurality of switches, each switch coupling a respective capacitor unit to a respective inductor, wherein multiple capacitor units are coupled to each inductor by separate switches. The plurality of switches are adapted to non-simultaneously discharge the multiple capacitor units to provide non-simultaneous pulses through a given inductor to the load and not through other inductors. The non-simultaneous pulses form at least a portion of an output pulse waveform to the load.

In another embodiment, the invention can be characterized as a method for providing a pulse waveform to a load, and a means for accomplishing the method, the method comprising the steps of: charging a plurality of capacitor units, wherein multiple capacitor units are coupled to each of a plurality of inductors, each inductor coupled to the load; and non-simultaneously discharging the multiple capacitor units to provide non-simultaneous pulses through a given inductor to the load and not through other inductors; wherein the non-simultaneous pulses form at least a portion of the pulse waveform.

BRIEF DESCRIPTION OF THE DRAWINGS

The above and other aspects, features and advantages of the present invention will be more apparent from the following more particular description thereof, presented in conjunction with the following drawings.

Corresponding reference characters indicate corresponding components throughout the several views of the drawings.

DETAILED DESCRIPTION

The following description is not to be taken in a limiting sense, but is made merely for the purpose of describing the general principles of the preferred embodiments. The scope of the invention should be determined with reference to the claims.

Figure 3:
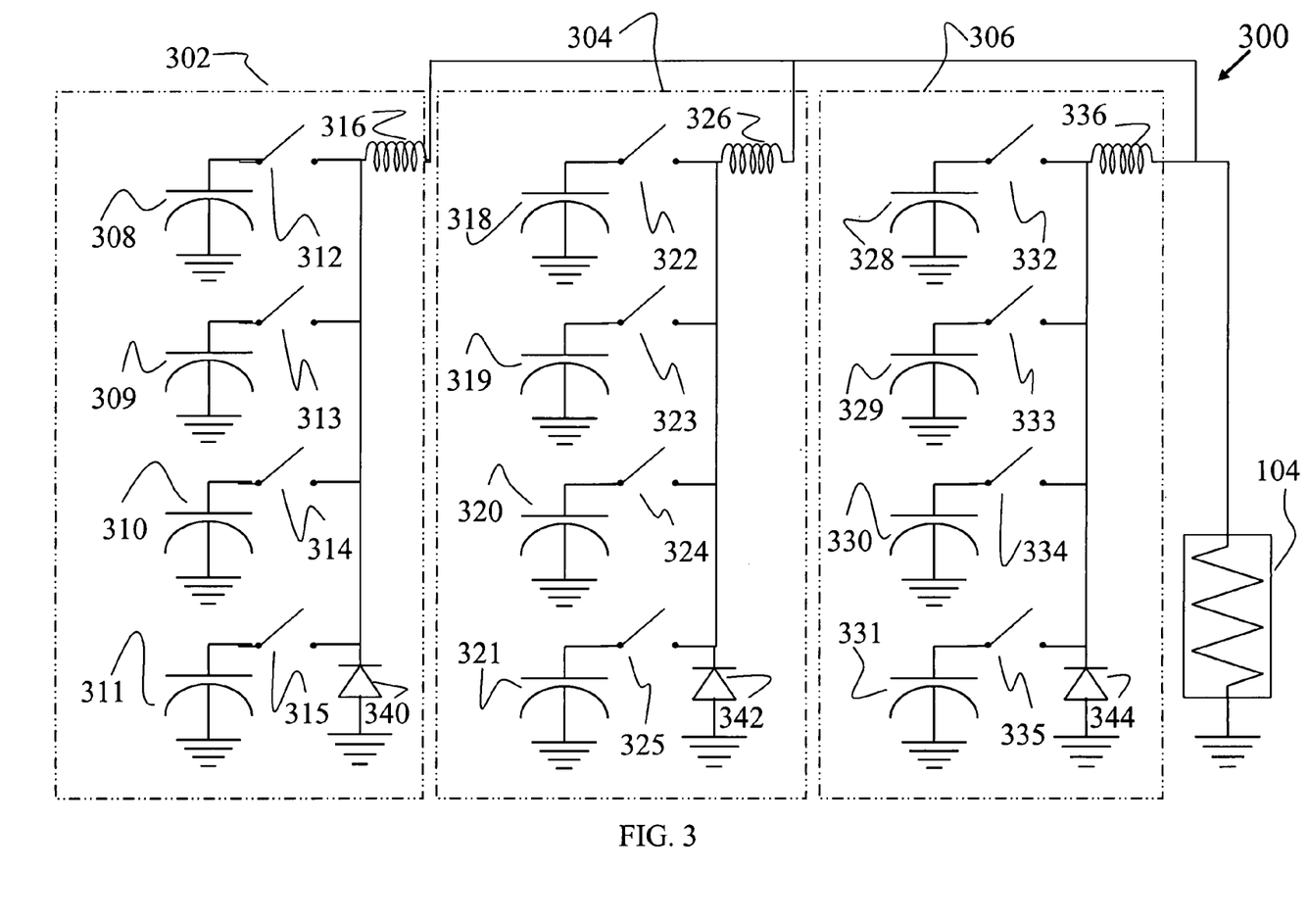
FIG. 3 is a diagram of a pulse forming network according to one embodiment of the invention.
Figure 4:
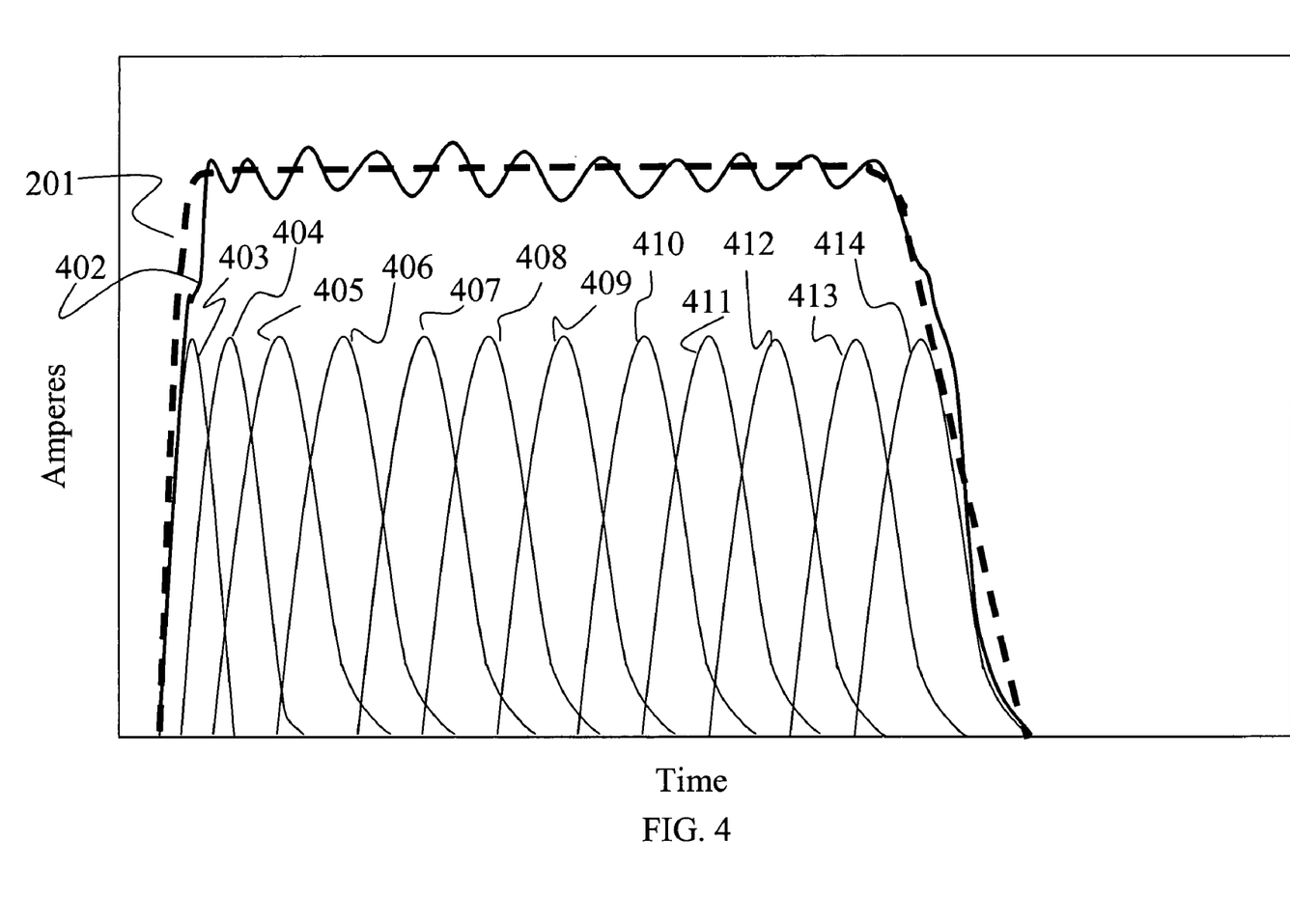
FIG. 4 is a graph illustrating an output pulse waveform produced by one embodiment of the pulse forming network of FIG. 3.

Referring first to FIG. 3, a diagram is shown of a pulse forming network according to one embodiment of the invention. Referring also to FIG. 4, a graph is shown illustrating an output pulse waveform produced by one embodiment of the pulse forming network of FIG. 3.

The pulse forming network 300 includes multiple capacitor units being switched through each inductor. Specifically, the pulse forming network 300 includes a plurality (e.g., three) energy storage modules 302, 304, 306 each coupled to a load 104. Each module 302, 304 and 306 includes a plurality (e.g., four) of capacitor units coupled to the load 104 through an inductor via a switch. Each module 302, 304, 306 also includes an anti-reversing diode. As illustrated, module 302 includes capacitor units 308, 309, 310 and 311, each coupled via one of switches 312, 313, 314 and 315 through inductor 316 to the load 104. Similarly, module 304 includes capacitor units 318, 319, 320 and 321, each coupled via one of switches 322, 323, 324 and 325 through inductor 326 to the load 104. And module 306 includes capacitor units 328, 329, 330 and 331, each coupled via one of switches 332, 333, 334 and 335 through inductor 336 to the load 104. Anti-reversing diodes 340, 342 and 344 are coupled to each module 302, 304 and 306 to prevent the voltage from reversing on the capacitors and assure unidirectional current flow through the switches. This also minimizes the circulating current from one module to enter another module.

According to several embodiments of the invention, the capacitor units of a given module are individually switched (discharged) through the same inductor at different times such that the same inductor is pulsed multiple times when forming the output pulse waveform (i.e., multiple discharge pulses are provided to the load 104 through the same inductor to the load 104 and not through the other inductors of the other modules). Thus, in a broad sense, multiple capacitor units are non-simultaneously discharged through each inductor of the network 300. Thus, each inductor is pulsed at a higher frequency than in traditional pulse forming networks. As described more fully below, this results in the use of fewer and smaller inductors, fewer anti-reversing diodes, better pulse shaping capabilities and overall reduction in size and mass relative to known pulse forming networks. It is noted that when referring to a discharge pulse flowing through a given inductor and not through the inductors of other modules, the discharge current through the given inductor flows generally directly to the load and does not flow through the other inductors on its path to the load. For example, in the illustrated embodiment, multiple inductors are not coupled in series to the load. However, it is understood that the discharging of any given capacitor unit will result in a small amount of stray induced currents in the other inductors, which is unavoidable. Accordingly, in preferred embodiments, the discharge current (not including stray induced current) flows through the given inductor and not through the other inductors.

Figure 5:
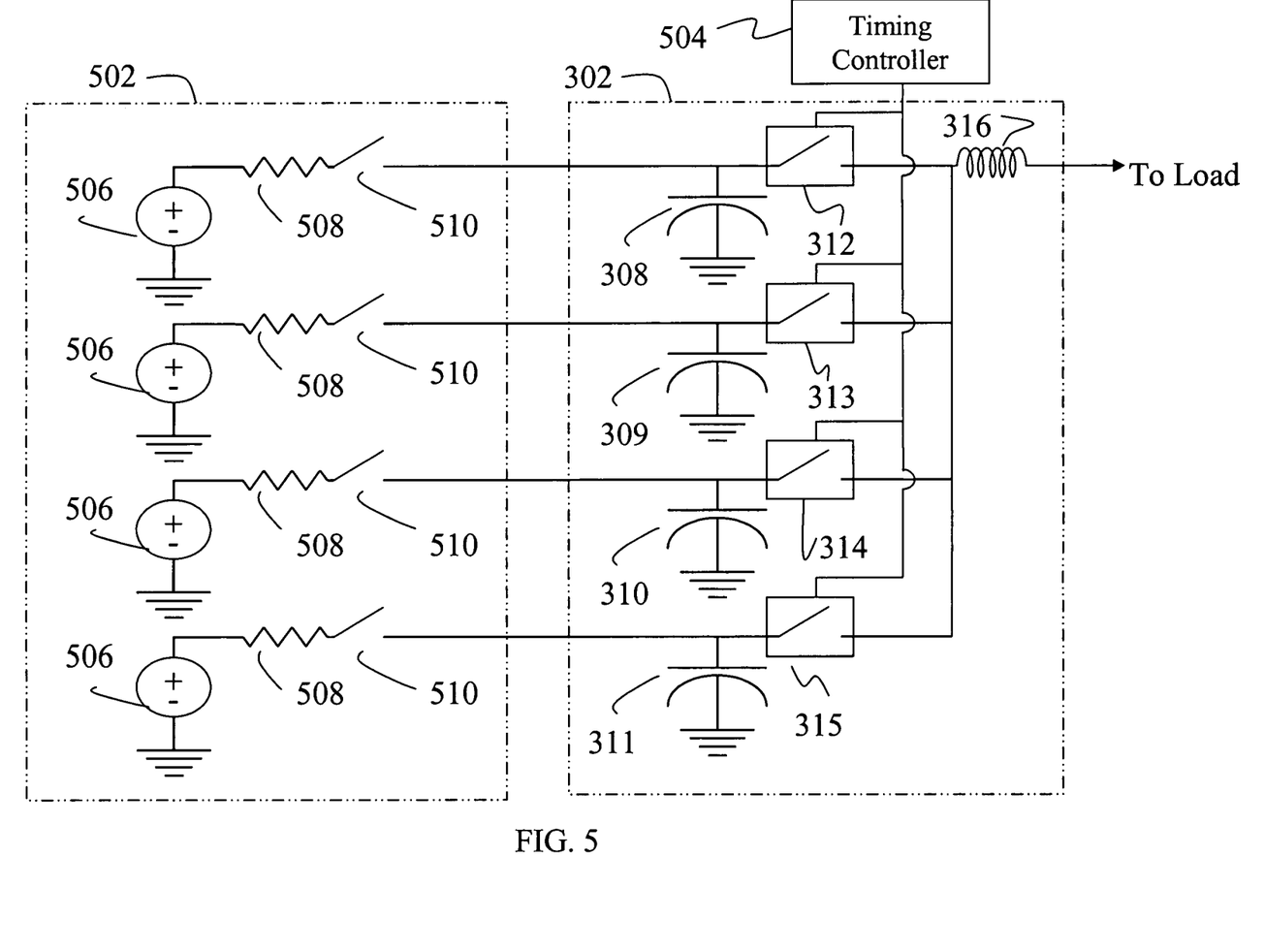
FIG. 5 is a diagram of an energy storage module of the pulse forming network of FIG. 3 including a charging power supply and a timing controller in accordance with one embodiment of the invention.

In operation, each of the capacitor units are charged to the appropriate voltage by a high voltage charging supply (such as illustrated in FIG. 5). In order to generate a waveform having a desired shape, the capacitor units are sequentially discharged in a predetermined sequence to produce that an output pulse waveform having the desired shape, such that the capacitor units of a given module are individually discharged at different times through the inductor of the given module, i.e., non-simultaneously discharged.

For example, in preferred embodiments, at the start of the pulse, switch 312 of module 302 is closed to discharge capacitor unit 308 through the inductor 316 to the load 104 and not through inductors 326, 336. This results in pulse 403 of FIG. 4. At a predetermined time after the closing of switch 312 (i.e., after beginning the discharge of capacitor unit 308), switch 322 of module 304 is closed to discharge capacitor unit 318 through the inductor 326 to the load 104 and not through inductors 316, 336, which results in pulse 404 of FIG. 4. Proceeding in sequence, switch 332 of module 306 is closed to discharge capacitor unit 328 through the inductor 336 to the load 104 and not through inductors 316, 326, which results in pulse 405 of FIG. 4. It is noted that switch 312 is now open. The switching sequence then continues back to module 302, such that switch 313 is closed to discharge capacitor unit 309 through the inductor 316 to the load 104 and not through inductors 326, 336, which results in pulse 406 of FIG. 4. It is preferred that the each capacitor unit of a given module completely discharge prior to the next capacitor unit of that module discharging, i.e., the pulses through a given inductor do not overlap in time. Thus, the switching timing is preferably such that pulse 406 starts after the end of pulse 403, and so on. However, in alternative embodiments, depending on the application, pulses through a given inductor may be made to overlap in time.

Accordingly, the switching sequence is such that the switches close in the order of 312, 322, 332, 313, 323, 333, 314, 324, 334, 315, 325 and 335 in order to sequentially discharge capacitor units 308, 318, 328, 309, 319, 329, 310, 320, 330, 311, 321 and 331 in order. Thus, current pulses 403, 404, 405, 406, 407, 408, 409, 410, 411, 412, 413 and 414 are sequentially produced in time at the load. The sum of the pulses 403–414 adds to the output pulse waveform 402, which more closely follows the desired flat top waveform 201 than the traditional network of FIGS. 1–2. Such waveforms are needed for various types of loads, including charged particle accelerators, microwave sources and lasers. Thus, in preferred embodiments, a first capacitor unit of each module is sequentially discharged, then a second capacitor unit of each module is sequentially discharged, then a third capacitor unit of each module is sequentially discharged, and so on until all capacitor units of all modules are discharged. Such sequence ensures that the capacitor units of each module are non-simultaneously discharged.

In one variation of a switching sequence, the first several capacitor units of the sequence are switched or pulsed at the same time in order to decrease the rise time of the pulse. This is advantageous in creating a flat top waveform. For example, switches 312 and 322 are closed at or very near the same time to discharge capacitor units 308 and 318 through inductors 316 and 326, respectively. After this initial pulsing, the sequence proceeds as described above, with the desired interval in between discharge pulses.

It is noted that in preferred embodiments, only one capacitor unit of a given module is switched through the inductor of that module at a time. Accordingly, less energy is switched through the inductor relative to traditional pulse forming networks. Therefore, the inductor has smaller inductance requirements, i.e., a smaller value inductor having less size and mass may be used in each module. In preferred embodiments, only one of the switches of a given module are closed at a time, while the other switches are open. For example, after switch 312 closes and completely discharges the capacitor unit 308, switch 312 naturally re-opens as a result of zero current flowing therethrough. In another example, switch 312 re-opens due to a commutation circuit that is coupled to switch 312 which forces the switch to re-open. In another example, if the switch 312 is conducting when switch 313 is closed, the closing of switch 313 will reverse the current through switch 312 to shut off or re-open switch 312. If switch 321 can be commutated, the closing of switch 313 acts as a commutation circuit to shut off switch 312.

Advantageously, since each inductor in the pulse forming network is pulsed multiple times (i.e., energy for multiple capacitor units is discharged through the same inductor) when forming the output pulse waveform, fewer inductors are required compared to a traditional pulse forming network that requires a single inductor for many modules, such as shown in FIG. 1. In FIG. 3, each inductor is pulsed 4 times per output pulse waveform, e.g., inductor 316 is pulsed 4 times (by discharges from each capacitor unit 309, 309, 310 and 311), producing pulses 403, 406, 409 and 412. In contrast, in FIG. 1, each inductor is pulsed once per output pulse waveform. Accordingly, the pulse forming network 300 of FIG. 3 including only three inductors can replace the pulse forming network of FIG. 1 having 72 inductors at the same energy level. This savings in the number of inductors represents a dramatic reduction in the size and mass of the pulse forming network. It is well known that inductors are the second largest mass component aside from the energy storage capacitor units in a pulse forming network.

It is noted that a pulse forming network in accordance with several embodiments of the invention may be implemented with as few as two inductors (i.e., two energy storage modules), each inductor (of each module) pulsed multiple times by different capacitor units to form the output pulse waveform. However, in order to ensure that a given capacitor unit (of a given module) is fully discharged prior to discharging the next capacitor unit coupled to the same inductor (of the same module), it is desired that the pulse forming network preferably have three or more inductors (thus, three or more modules as defined). Additionally, it is noted that a pulse forming network in accordance with several embodiments of the invention may be implemented with as few as two capacitor units coupled to each inductor; however, in preferred embodiments, four or more capacitor units are coupled to each inductor.

Furthermore, since each inductor in the pulse forming network is pulsed at a higher frequency and switching smaller amounts of capacitance at a given time, the inductors themselves may be made smaller to handle less energy at a given time. This further reduces the size and mass of the inductors in the network relative to a traditional network, such as illustrated in FIG. 1.

The capacitor units of FIG. 3 may each comprise one or more capacitors. That is, each capacitor unit may be a single capacitor or may be a bank of capacitors in series and/or in parallel configured to provide the proper amount of energy storage. The energy storage capacitors typically comprise the largest size and mass components of the pulse forming network.

The switches illustrated in the energy storage modules 302, 304, 306 of FIG. 3 may each comprise one or more switches. Depending on the embodiment, the switches may be any type of switching device, preferably a switching device that can shut off (or be shut off). For example, the switches may be solid state switches, such as silicon controlled rectifiers (SCR), gate-turn-off switches (GTO), bipolar junction transistors (BJT), field effect transistors (FET), insulated-gated bipolar transistors (IGBT) or other transistor. For example, in one embodiment, each switch comprises a transistor and a diode in series such that it behaves as an SCR. The switches may also be electromechanical switches, such as a spark gap, if the pulsing frequency is sufficient to allow the switch to turn off between pulses of the same inductor (of the same module). Even if the switch has not turned off yet, the closing of the next switch in the same module will act to shut off the previous switch.

In comparison to traditional pulse forming networks, in many embodiments, the number of switches increases. However, the total energy switched will remain the same and the size and mass of the switches is normally significantly less that the size and mass of the inductors. Thus, even though there may be more switches present, the overall mass and size of the pulse forming network is reduced due to the reduction in the number and size of inductors and a reduction in the number of anti-reversing diodes.

It is also noted that compared to known pulse forming networks, the switches are grouped together. For example, in FIG. 1, each illustrated switch is a grouping of switches. Whereas according to several embodiments, the switches are spatially distributed within a given module to individually switch capacitor units. Since the switches are distributed throughout a given module, the switches are easier to cool than if the switches are bunched together. In preferred embodiments, the switches are mounted on the capacitor units, the capacitor units used to cool the switches.

Additionally, as illustrated in FIG. 3, one anti-reversing diode 340, 342, 344 is coupled to each inductor 316, 326, 336 in each energy storage module 302, 304, 306. These anti-reversing diodes primarily function to limit voltage reversal on the capacitors, which may cause the current discharged from a given capacitor unit into the inductor of that module from flowing back through the switch into the capacitor. Thus, the anti-reversing diodes limit current oscillation between the capacitor units and the load. These anti-reversing diodes also minimize current discharge from other modules from discharging into each module such that substantially all discharge current flows to the load 104, not including induced stray currents in the other inductors. That is, the discharging of one capacitor unit induces a small amount of stray current in the other inductors; however, this induced stray current is different than the discharge current from the capacitor unit. It is also noted that generally, anti-reversing diodes are not required in order to minimize current discharge from other modules from discharging into each module, since the impedance of the load 104 is generally very small relative to the impedance of the other modules. That is, the discharge current naturally flows through a given inductor directly to the load, and not through the other inductors of the other modules. Relative to the known pulse forming network of FIG. 1, since there are fewer inductors required, there are likewise fewer anti-reversing diodes required. In the example provided, 3 diodes are used in the network 300 compared to 72 diodes used in FIG. 1. This again results in a savings of size and mass in the pulse forming network 300.

It is also shown that the pulse forming network 300 according to many embodiments of the invention improves pulse shaping abilities relative to known pulse forming networks. For example, the output pulse waveform 402 of FIG. 4 more closely emulates the desired flat top output waveform 201 than does waveform 208 of FIG. 2. Furthermore, depending on the timing of the discharge switches, the designer may be able to accurately create many different pulse shapes. For example, while a square or rectangular waveform is described herein as being preferred, it is understood that it may be desired to output a triangular waveform, a waveform that ramps up or down, or other desired pulse shape depending on the application requiring the pulse. Thus, by varying the timing of discharge pulses relative to each other (controlling the switching sequence and timing), the shape of the output waveform may be varied.

The higher pulsing frequency of each inductor also provides for faster rise times according to several embodiments. That is, as seen by comparing FIGS. 2 and 4, it takes less time to go from 10% to 90% of the peak current in FIG. 4 than in FIG. 2. Faster rise times are important in microwave applications where it is desired to quickly turn on a radiation source. The ability to emulate the ideal waveform more closely results in less energy wasted in the network 300. Wasted energy is not preferred since the pulse forming network must be appropriately sized and charged to provide the needed energy as well as the un-usable wasted energy. Therefore, wasting less energy results in the ability to design a network that more closely matches the energy requirements of the load.

The higher pulsing frequency of each inductor also provides for faster shut off times according to several embodiments. Advantageously, this results less wasted energy at the end of the output pulse waveform. This wasted energy is illustrated as area 212 in FIG. 2. In contrast, depending on the timing of the discharge pulses, this wasted energy can be significantly decreased, made negligible, or eliminated. In applications such as launching electromagnetic weapons, such as rail guns excess wasted energy at the end of the pulse waveform can result in muzzle flash. By reducing or eliminating this wasted energy, flash suppressors are not required. Additionally, recovery systems (such as those used in rotating machinery based devices) are not required. Again, wasted energy is energy that must be stored by the pulse forming network 300, but which is not used. Thus, if there is less wasted energy, the energy storage components of the network 300 may be sized most closely to the requirements of the load, without having be oversized to account for wasted energy.

Many of the advantages described above result in a pulse forming network that can be reduced in size, mass and cost while providing better performance and efficiency. For example, the inductor requirements are reduced (in terms of the number and size/mass of inductors), the diode requirements are reduced (since there are fewer inductors, fewer diodes are required), and there is a reduction in the amount of wasted energy, particularly at the end of the output waveform (which results in a reduced energy storage requirement and a smaller network).

Referring next to FIG. 5, a diagram is shown of an energy storage module of the pulse forming network of FIG. 3 including a charging power supply and a timing controller in accordance with one embodiment of the invention. Although the circuit of FIG. 3 is generalized, it is understood that additional components are needed to fully operate the pulse forming network 300. For example, a charging circuit 502 is coupled to each capacitor unit of the network (e.g., to capacitor units 308, 309, 310 and 311 as illustrated). Additionally, a timing controller 504 is coupled to each discharge switch in this module as well as the other modules (e.g., switches 312, 313, 314, 315, 322, 323, 324, 325, 332, 333, 334 and 335) in order to control the discharging sequence. It is understood that although only one module (e.g., module 302) is illustrated, all modules are similarly coupled to the charging circuit 502 and the timing controller 504.

The charging circuit 502 includes a charging power supply 506 that is coupled to each capacitor unit through a respective charging resistor 508 and a respective charging switch 510. For example, as illustrated, a separate charging power supply 506 is coupled to each capacitor unit. In operation, the charging switches 510 are closed while the discharging switches (e.g., switches 312, 313, 314, 315) are open. This allows charging current from the power supplies 506 to charge the capacitor units to the proper voltage. Such charging circuits are well known in the art.

Figure 6:
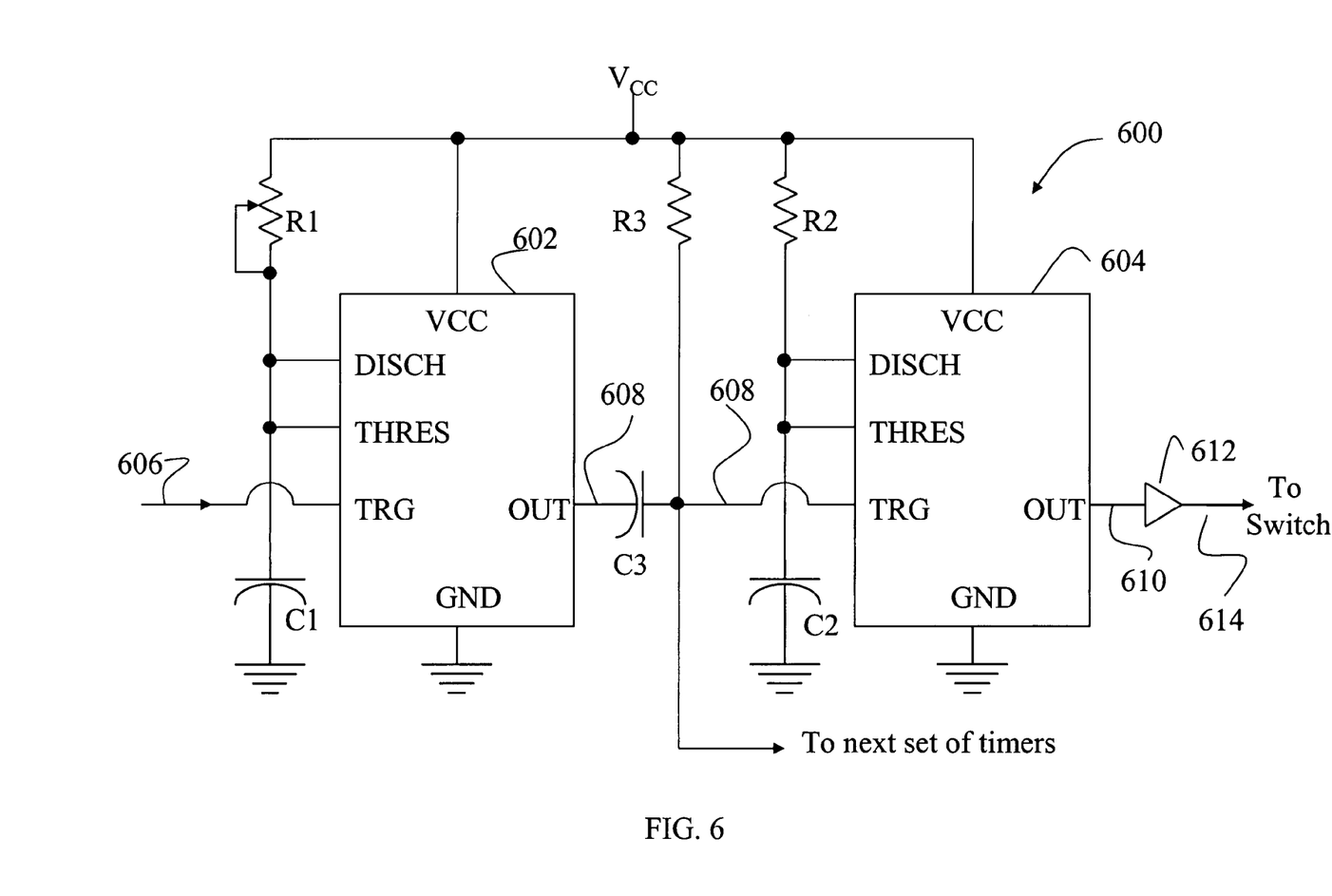
FIG. 6 is a diagram of a portion of the timing controller of FIG. 5 for controlling the discharging of a capacitor unit of the pulse forming network of FIG. 3 according to one embodiment of the invention.

The timing controller 504 provides the necessary signaling to causing the sequential switching of the discharge switches in each module in order to discharge the capacitor units in sequence, such that the inductors are pulsed at a higher frequency than is traditionally done. In one embodiment, the timing controller 504 comprises a timing circuit including many 555 timers, a portion of which is illustrated in FIG. 6. A 555 timer is a well known integrated circuit used in applications requiring precision timing, pulse generation, sequential timing, time delay generation and pulse width modulation. A 555 timer includes two voltage dividers, a bi-stable flip flop, a discharge transistor and a resistor divider network.

Referring to FIG. 6, a diagram is shown of a portion of the timing controller 504 of FIG. 5 for controlling the discharging of a capacitor unit of the pulse forming network of FIG. 3 according to one embodiment of the invention.

In preferred embodiments, the timing circuit includes two 555 timers per discharge switch in the pulse forming network. The portion 600 of the timing circuit includes two 555 timers: timer 602 which controls the timing sequence and timer 604 which holds the switch closed during the remaining discharge sequences. Timer 602 has a capacitor C1 and a variable resistor R1 (e.g., a potentiometer) coupled thereto (at the Threshold and Discharge pins), while timer 604 has a capacitor C2 and a fixed resistor R2 coupled thereto. Power ($V_{CC}$) is supplied to all components. Generally, every 3 RC time constants, a 555 Timer changes state. An input trigger signal 606 is received at the timer 602 (at the trigger pin), which is used to determine the timing between pulses, while timer 604 turns on (i.e., closes) a discharge switch. For example, the output 608 of timer 602 becomes the input trigger signal to the first one of the next pair of 555 timers in the timing circuit that corresponds to the next sequential capacitor unit to be discharged. The output 608 of timer 602 is also input as the input trigger signal (at the trigger pin) to timer 604. Capacitor C3 and resistor R3 allow the output signal 608 to trigger the timer 604 and to trigger the next pair of timers in the sequence. The output 610 of timer 604 is used to activate the closing of a particular switch (and the discharging of a particular capacitor unit) and hold it in that position for a specified interval. The output 610 is amplified at amplifier 612 (e.g., an op-amp) to become the discharge timing signal 614 that is coupled to the respective switch of the network. Again, the output 608 becomes the input trigger signal 606 of the next set of timers corresponding to the next switch and capacitor unit to be discharged.

In this embodiment, each discharge switch (e.g., switch 312) comprises a transistor and a diode in series that behave as a silicon controlled rectifier (SCR) in that the switch shuts off (i.e., opens) when the discharge current from the capacitor unit reaches zero. In this embodiment, each switch of a given module is allowed to stay open in between switching so that a given capacitor is not re-charged by the discharge of another capacitor of the same module.

In order to cause the proper timing in the discharge sequence, the values of capacitors C1 and C2, variable resistor R1 and fixed resistor R2 are selected. Gross timing changes may be made by changing the capacitance C1 and C2, while fine timing changes may be made by changing the variable resistor R1 and the fixed resistor R2. The ability to generate and adjust and appropriate timing circuit is known to one of ordinary skill in the art.

In one embodiment of the pulse forming network 300 of FIG. 3, the discharge timing of the last capacitor units of the discharge sequence is varied in order to further increase the shut off time. By way of example, a pulse forming network having 4 inductors (i.e., 4 modules) is described. In this example, the components of FIG. 3 will be referred to with the addition of a fourth module (having a fourth inductor) identical to one of the other modules 302, 304, 306. The fourth module is referred to as M4 including an inductor L4, four capacitor units C1, C2, C3, C4 and four switches S1, S2, S3, S4. Accordingly, the last capacitor unit of each module (i.e., the last capacitor units in the discharge sequence, in this case, capacitor units 311, 321, 331 and C4) is discharged such that each successive capacitor pulse resonates at a higher frequency odd harmonic (which also has a lower amplitude) than the preceding discharge pulse in the sequence. This can be done in an attempt to emulate the back end of a square wave which can be expressed as the sum of an infinite number of odd harmonics each at $(1/n)$ *$\sin(n\alpha)$, where n is an odd integer (i.e., n=1, 3, 5, 7 . . . ). Thus, each higher frequency odd harmonic has a frequency that is n times the fundamental frequency and $(1/n)$ times the amplitude of the fundamental frequency.

For example, the discharge pulse from capacitor unit 321 resonates at the third harmonic of the discharge pulse from capacitor unit 311 (which is at the fundamental frequency). Likewise, the discharge pulse from capacitor unit 331 resonates at the fifth harmonic of the discharge pulse from capacitor unit 311. And, the discharge pulse from capacitor unit C4 resonates at the seventh harmonic of the discharge pulse from capacitor unit 311. This is due to the well known fact that a square waveform is the sum of the odd harmonics. Accordingly, the final 4 pulses in the pulse sequence from the discharge capacitor units will add together to form a square waveform at the end of the output pulse waveform. Advantageously, this drastically reduces wasted energy at the end of the output waveform. For example, in some embodiments, the wasted energy may be reduced by as much as 70% or more.

In order that the discharge pulse from each of these last capacitor units in the pulse sequence resonates as described above, in one embodiment, the timing between subsequent pulses when discharging these last capacitor units of the sequence is successively shortened. For example, capacitor unit 321 is discharged in about half of the typical switching period. Thus, the product of the capacitance of the capacitor unit 321 and the circuit inductance 326 is reduced to $1/9$ of the value for 311, 316, plus the load 104 (the capacitance inductance product) to achieve resonance at the third harmonic using the relationship $$\frac{1}{\sqrt{LC}}.$$

Likewise, the switching period between capacitor units 331 and 321 is further decreased such that the capacitor unit 331 has effectively $1/25$ of its capacitance inductance product for the fifth harmonic. And the switching period between capacitor units C4 and 331 is even further decreased such that the capacitor unit C4 has effectively $1/49$ of its capacitance inductance product for the seventh harmonic. In addition, especially with the final capacitor unit C4 in the switching sequence, the inductor value may be varied since it may be difficult to adjust the capacitance of C4 to $1/49$ of its value simply by decreasing the timing. For example, a portion of the inductor L4 could be shorted out (or bypassed) while decreasing the timing such that the output pulse is at the desired odd harmonic, which is easily understood to one of ordinary skill in the art.

It is understood that the exact timing provided to achieve the desired result that the last multiple pulses in the pulse sequence are odd harmonics that add to form a square wave may need to be slightly varied for a specific application to achieve the proper shut off time. Advantageously, by further decreasing the shut off time, very little energy is wasted at the end of the output pulse waveform. Thus, the energy storage requirements of the pulse forming network may be designed to more closely match that the pulse requirements of the load. That is, the pulse forming network does not have to be oversized to account for wasted energy.

Figure 7:
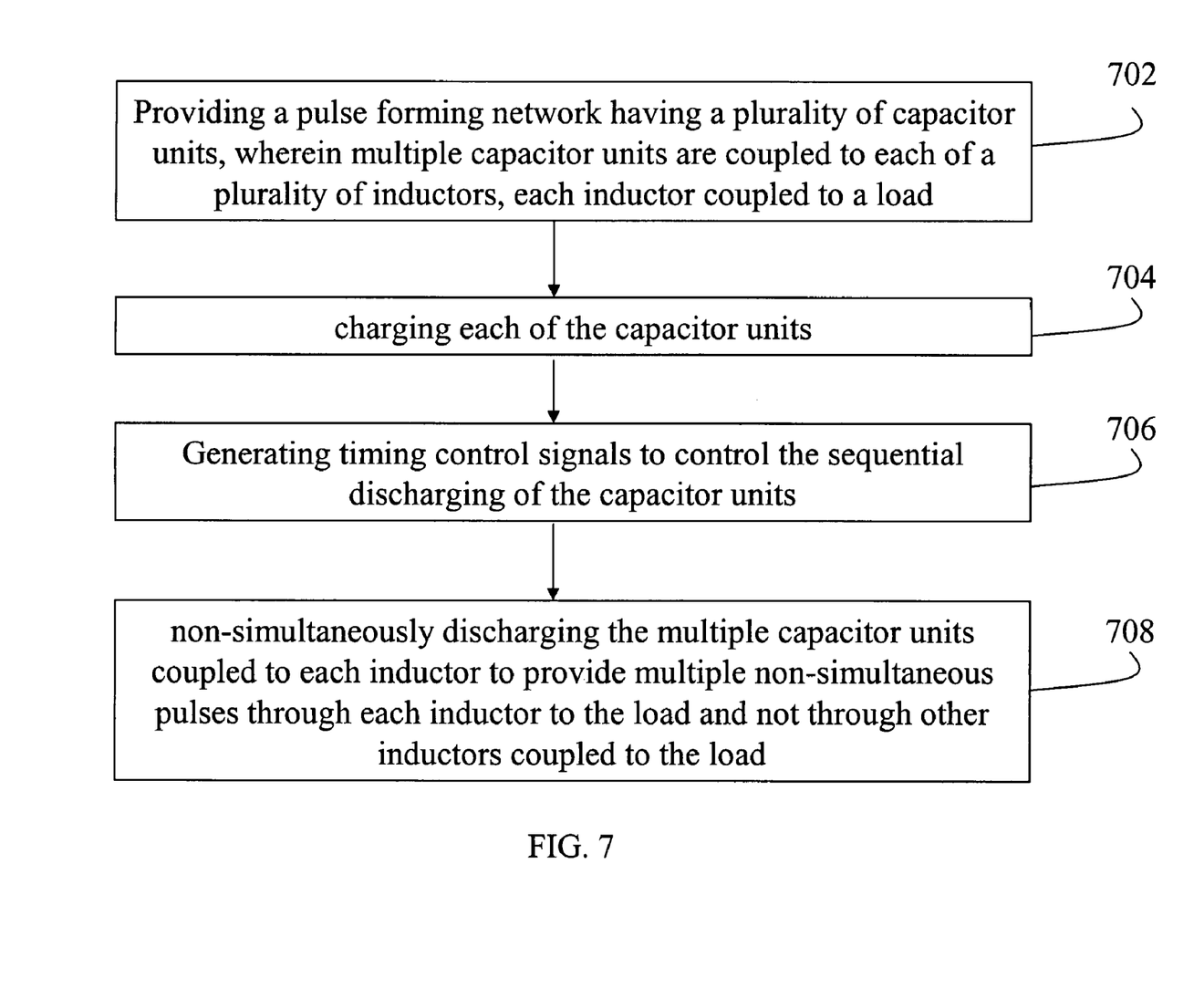
FIG. 7 a flowchart illustrating the steps performed in accordance with one embodiment of the invention.

Referring next to FIG. 7, a flowchart is shown illustrating the steps performed in accordance with one embodiment of the invention. This method may be performed, for example, by any of the pulse forming networks described herein.

Initially, a pulse forming network is provided having a plurality of capacitor units, wherein multiple capacitor units are coupled to each of a plurality of inductors, each inductor coupled to a load (Step 702). For example, the network 300 of FIG. 3 may be provided; however, it is understood that other pulse forming networks than those specifically described herein may be used. Next, each of the capacitor units is charged to an appropriate voltage level (Step 704). Such may be accomplished by coupling the capacitor units to an appropriate charging power supply.

Next the pulse forming network is ready to be discharged to form the output pulse waveform to a load. First, timing control signals are generated to control the sequential discharging of the capacitor units in the desired sequence at the proper timing (Step 706). In one embodiment, a timing controller is used to generate such timing control signals and output them to the respective switches, which when closed, will discharge a particular capacitor unit. For example, a timing circuit such as described in FIG. 6 may be used.

As a result of the timing control signals, the multiple capacitor units coupled to each inductor are non-simultaneously discharged to provide multiple non-simultaneous pulses through each inductor to the load and not through other inductors coupled to the load (Step 708). As described above, this is understood to mean that the discharge current from a given capacitor unit discharged to form a given pulse flows through its given inductor to the load and not through other inductors on its path to the load (not including stray currents induced in each of the other inductors when discharging the given capacitor unit). Accordingly, each of the inductors is coupled to the load such that the current flowing therethrough does not pass through the other inductors on its path to the load. For example, in preferred embodiments, multiple inductors are not coupled in series to the load. Furthermore, the impedance of the load is very small relative to the impedance of the other inductors such that the discharge current from a given capacitor unit naturally flows through a given inductor directly to the load, and not through the other inductors. It is further noted that the load includes an inductance; however, this load inductance is distinct from the discharge inductors that are each coupled to the load.

For example, in FIG. 3, capacitor units 308, 309, 310 and 311 are discharged at different times. In preferred embodiments, the pulses through a given inductor do not overlap in time. For example, in one embodiment of FIG. 4, the pulses 403, 406, 409 and 412 do not overlap in time. In one embodiment, the multiple capacitor units are each discharged by the non-simultaneous closing of respective switches coupled to the multiple capacitor units. It is also noted that in some embodiments, some capacitor units coupled to different inductors may be discharged at or near the same time. For example, during the first pulses of the sequence, the first two capacitor units of the sequence (each coupled to different inductors) are discharged at or near the same time in order to decrease the rise time of the pulse in order to better emulate a flat top pulse waveform.

Furthermore, in preferred embodiments, groups of the multiple capacitor units coupled to a respective inductor each comprise one of a plurality of energy storage modules. According to one example, a discharge sequence is provided where given capacitor unit of each energy storage module is sequentially discharged over time to provide a given pulse through each inductor. Then, after beginning the discharging of the given capacitor unit of the last sequential module, a subsequent capacitor unit of each energy storage module is sequentially discharged over time to provide a subsequent pulse through each inductor to the load. For example, in one embodiment of FIG. 3, capacitor units 308, 318 and 328 are sequentially discharged. Then, after beginning to discharge capacitor unit 328, capacitor units 309, 319 and 329 are sequentially discharged. Then, after beginning to discharge capacitor unit 329, capacitor units 310, 320 and 330 are sequentially discharged.

Furthermore, in some embodiments, the discharge timing is such that the last capacitor units in the discharging sequence are discharged at a successively higher frequency to produce the last pulses of a pulse sequence, such that each of the last pulses resonates at a higher frequency odd harmonic relative to a preceding pulse. Accordingly, the sum of the last pulses in the sequence substantially form a square waveform. This results in a faster shut off time for the output pulse waveform. For example, in one embodiment of FIG. 3, capacitor unit 321 is discharged through inductor 326 sooner such that the resulting pulse resonates at a third odd harmonic of the pulse from capacitor unit 311, while capacitor unit 331 is discharged through inductor 336 successively sooner such that the resulting pulse resonates at a fifth odd harmonic of the pulse from capacitor unit 311. This may be affected by changing the timing of the appropriate signals that cause the last multiple capacitor units to discharge.

While the invention herein disclosed has been described by means of specific embodiments and applications thereof, numerous modifications and variations could be made thereto by those skilled in the art without departing from the scope of the invention set forth in the claims.

What is claimed is:

1. A capacitor based pulse forming network comprising:
a plurality of inductors adapted to be coupled to a load;
a plurality of capacitor units;
a plurality of switches, each switch coupling a respective capacitor unit to a respective inductor, wherein multiple capacitor units are coupled to each inductor by separate switches; and
the plurality of switches are adapted to non-simultaneously discharge the multiple capacitor units to provide non-simultaneous pulses through a given inductor to the load and not through other inductors;
wherein the non-simultaneous pulses form at least a portion of an output pulse waveform to the load.

2. The network of claim 1 further comprising:
a charging circuit coupled to each capacitor unit.

3. The network of claim 1 further comprising:
a timing controller coupled to each switch, the timing controller adapted to output a signal at an appropriate time to cause each switch to discharge a respective capacitor unit.

4. The network of claim 1 further comprising:
an anti-reversing diode coupled to each inductor, the anti-reversing diode coupled to a given inductor for limiting voltage reversal across discharged capacitor units.

5. The network of claim 1 wherein the non-simultaneous pulses through the given inductor do not overlap in time with each other.

6. The network of claim 1 wherein the non-simultaneous pulses through the given inductor are non-simultaneous with pulses through the other inductors.

7. The network of claim 1 wherein plurality of switches are adapted to sequentially discharge the plurality of capacitor units.

8. The network of claim 1 wherein the plurality of switches are adapted to discharge the last capacitor units in a discharging sequence at a successively higher frequency to produce the last pulses of a pulse sequence, such that each of the last pulses resonates at a higher frequency odd harmonic relative to a preceding pulse, such that sum of the last pulses substantially comprises a square waveform, wherein resulting a faster shut off time for the output pulse waveform.

9. The network of claim 1 wherein each switch comprises one or more solid state switches.

10. The network of claim 1 wherein each switch comprises one or more electromechanical switches.

11. The network of claim 1 wherein each switch is commutated off after the given capacitor unit has discharged.

12. The network of claim 1 wherein a switch is commutated off by closing a subsequent switch coupled to another capacitor unit coupled to the same inductor.

13. The network of claim 1 wherein each capacitor unit comprises one or more capacitors.

14. The network of claim 1 wherein groups of the multiple capacitor units coupled by a respective switch to a respective inductor each comprise one of a plurality of energy storage modules.

15. The network of claim 14 wherein the plurality of switches are adapted to:
sequentially discharge a first capacitor unit of each energy storage module over time to provide a first pulse through each inductor to the load and not through inductors of other energy storage modules; and
sequentially discharge, after beginning the sequential discharge of the first capacitor unit of each energy storage module, a second capacitor unit of each energy storage module over time to provide a second pulse through each inductor to the load and not through the inductors of the other energy storage modules.

16. The network of claim 14 wherein the plurality of switches are adapted to:
sequentially discharge a first capacitor unit of each energy storage module over time to provide a first pulse through each inductor to the load and not through inductors of other energy storage modules; and sequentially discharge, after beginning the discharge of the first capacitor unit of the last sequential energy storage module, a subsequent capacitor unit of each energy storage module over time to provide a subsequent pulse through each inductor to the load and not through the inductors of the other energy storage modules, wherein the subsequent pulse does not overlap in time with the first pulse of each energy storage module.

17. The network of claim 16 wherein the plurality of switches are adapted to:
repeat the sequential discharge of additional subsequent capacitor units to provide additional subsequent pulses through each inductor to the load until all of the plurality of capacitor units have been discharged.

18. The network of claim 16 wherein the plurality of switches are further adapted to:
sequentially discharge a last capacitor unit of a given energy storage module at a higher frequency such that a last pulse of the last capacitor unit resonates at a higher frequency odd harmonic relative to a last pulse of a sequentially preceding last capacitor unit of a sequentially preceding energy storage module, wherein causing a faster shut off time for the output pulse waveform.

19. A method for providing a pulse waveform to a load comprising:
charging a plurality of capacitor units, wherein multiple capacitor units are coupled to each of a plurality of inductors, each inductor coupled to the load; and
non-simultaneously discharging the multiple capacitor units to provide non-simultaneous pulses through a given inductor to the load and not through other inductors;
wherein the non-simultaneous pulses form at least a portion of the pulse waveform.

20. The method of claim 19 further comprising:
receiving timing signals at appropriate times to trigger the non-simultaneous discharging.

21. The method of claim 19 further comprising:
limiting voltage reversal across discharged capacitor units.

22. The method of claim 19 wherein the non-simultaneous pulses through the given inductor do not overlap in time with each other.

23. The method of claim 19 wherein the non-simultaneous pulses through the given inductor are non-simultaneous with pulses through the other inductors.

24. The method of claim 19 further comprising:
sequentially discharging the plurality of capacitor units.

25. The method of claim 19 wherein the non-simultaneous discharging step comprises:
sequentially discharging the multiple capacitor units to provide sequential pulses through the given inductor to the load and not through other inductors.

26. The method of claim 19 further comprising:
discharging the last capacitor units in a discharging sequence at a successively higher frequency to produce the last pulses of a pulse sequence, such that each of the last pulses resonates at a higher frequency odd harmonic relative to a preceding pulse, such that sum of the last pulses substantially comprises a square waveform, wherein resulting a faster shut off time for the output pulse waveform.

27. The method of claim 19 wherein the non-simultaneously discharging step comprises:

non-simultaneously closing respective switches, each switch coupling each of the multiple capacitor units to the given inductor.

28. The method of claim 27 further comprising:
opening each switch through commutation.

29. The method of claim 27 wherein closing a respective switch of the multiple capacitor units commutates open a previously closed switch of the multiple capacitor units.

30. The method of claim 19 wherein groups of the multiple capacitor units coupled to a respective inductor each comprise one of a plurality of energy storage modules.

31. The method of claim 30 further comprising:
sequentially discharging a first capacitor unit of each energy storage module over time to provide a first pulse through each inductor to the load and not through inductors of other energy storage modules; and
sequentially discharging, after beginning the sequential discharging of the first capacitor unit of each energy storage module, a second capacitor unit of each energy storage module over time to provide a second pulse through each inductor to the load and not through the inductors of the other energy storage modules.

32. The method of claim 30 further comprising:
sequentially discharging a first capacitor unit of each energy storage module over time to provide a first pulse through each inductor to the load and not through inductors of other energy storage modules; and
sequentially discharging, after beginning the discharging of the first capacitor unit of the last sequential energy storage module, a subsequent capacitor unit of each energy storage module over time to provide a subsequent pulse through each inductor to the load and not through the inductors of the other energy storage modules, wherein the subsequent pulse does not overlap in time with the first pulse of each energy storage module.

33. The method of claim 32 further comprising:
repeating the sequentially discharging the subsequent capacitor units for additional subsequent capacitor units to provide additional subsequent pulses through each inductor to the load until all of the plurality of capacitor units have been discharged.

34. The method of claim 32 further comprising:
sequentially discharging a last capacitor unit of a given energy storage module at a higher frequency such that a last pulse of the last capacitor unit resonates at a higher frequency odd harmonic relative to a last pulse of a sequentially preceding last capacitor unit of a sequentially preceding energy storage module, wherein causing a faster shut off time for the output pulse waveform.

35. A capacitor based pulse forming network comprising:
means for charging a plurality of capacitor units, wherein multiple capacitor units are coupled to each of a plurality of inductors, each inductor coupled to the load; and
means for non-simultaneously discharging the multiple capacitor units to provide non-simultaneous pulses through a given inductor to the load and not through other inductors;
wherein the non-simultaneous pulses form at least a portion of the pulse waveform.

* * * * *